United States Patent
Barclay et al.

(10) Patent No.: US 7,022,455 B2
(45) Date of Patent: Apr. 4, 2006

(54) PHOTOACID-LABILE POLYMERS AND PHOTORESISTS COMPRISING SAME

(75) Inventors: George G. Barclay, Jefferson, MA (US); Patrick J. Bolton, McMurray, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/327,450

(22) Filed: Dec. 20, 2002

(65) Prior Publication Data

US 2003/0232274 A1 Dec. 18, 2003

Related U.S. Application Data

(60) Provisional application No. 60/343,824, filed on Dec. 28, 2001.

(51) Int. Cl.
*G03C 1/73* (2006.01)
*G03F 7/039* (2006.01)
*G03F 7/20* (2006.01)
*G03F 7/30* (2006.01)

(52) U.S. Cl. ............... 430/270.1; 430/326; 430/910; 430/311

(58) Field of Classification Search ............ 430/270.1, 430/325, 326, 905, 910, 914, 311
See application file for complete search history.

(56) References Cited

U.S. PATENT DOCUMENTS

| | | | |
|---|---|---|---|
| 5,071,730 A | 12/1991 | Allen et al. | 430/270.1 |
| 5,110,709 A * | 5/1992 | Aoai et al. | 430/271.1 |
| 5,352,564 A | 10/1994 | Takeda et al. | 430/270.1 |
| 5,432,039 A * | 7/1995 | Shimokawa et al. | 430/191 |
| 5,443,690 A * | 8/1995 | Takechi et al. | 430/286.1 |
| 5,506,088 A * | 4/1996 | Nozaki et al. | 430/270.1 |
| 5,558,971 A | 9/1996 | Urano et al. | 430/170 |
| 5,688,628 A * | 11/1997 | Oie et al. | 430/176 |
| 5,786,131 A | 7/1998 | Allen et al. | 430/325 |
| 5,861,231 A | 1/1999 | Barclay et al. | 430/270.1 |
| 5,866,304 A | 2/1999 | Nakano et al. | 430/325 |
| 6,042,997 A | 3/2000 | Barclay et al. | 430/315 |
| 6,136,501 A | 10/2000 | Trefonas et al. | 430/270.1 |
| RE37,179 E | 5/2001 | Yamachika et al. | 430/191 |
| 6,379,861 B1 | 4/2002 | Trefonas et al. | 430/270.1 |

* cited by examiner

*Primary Examiner*—Sin Lee
(74) *Attorney, Agent, or Firm*—Peter F. Corless; Darryl P. Frickey; Edwards Angell Palmer & Dodge

(57) ABSTRACT

The present invention relates to new polymers that contain photoacid-labile groups that comprise arylalkyl groups. Particularly preferred are polymers having a benzylic carbon directly linked to an ester oxygen. Polymers of the invention are useful as a component of chemically-amplified positive-acting resists.

19 Claims, No Drawings

PHOTOACID-LABILE POLYMERS AND PHOTORESISTS COMPRISING SAME

The present application claims the benefit of U.S. provisional application No. 60/343,824, filed Dec. 28, 2001, which is incorporated herein by reference in its entirety.

BACKGROUND OF THE INVENTION

1. Field of the Invention

The present invention relates to new polymers that contain photoacid-labile groups that comprise arylalkyl groups. Particularly preferred are polymers having a benzylic carbon directly linked to an ester oxygen. Polymers of the invention are particularly useful as a component of chemically-amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4 both incorporated herein by reference for their teaching of photoresist compositions and methods of making and using the same.

Chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11$^{th}$ International Conference on Photopolymers* (*Soc. Of Plastics Engineers*), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 270 nm or less, such as wavelengths of about 248 nm (provided by KrF laser). Use of such short exposure wavelengths can enable formation of smaller features. Accordingly, a photoresist that yields well-resolved images upon 248 nm exposure could enable formation of extremely small (e.g. sub-0.25 µm) features that respond to constant industry demands for smaller dimension circuit patterns, e.g. to provide greater circuit density and enhanced device performance.

It thus would be desirable to have new photoresist compositions, particularly resist compositions that can be imaged at short wavelengths such as 248 nm. It would be particularly desirable to have such resist compositions that can provide high resolution relief images.

SUMMARY OF THE INVENTION

We have now found new polymers that contain photoacid-labile units that contain an arylalkyl group such as a benzylic group. Particularly preferred polymers of the invention contain polymerized phenolic units as well as photoacid-labile groups that contain an arylalkyl group such as a benzylic group.

Polymers of the invention are highly useful as a resin component of a positive-acting photoresist composition. Resists of the invention typically contain a photoactive component such as one or more photoacid generator compounds in addition to the resin component.

We have found that resists of the invention can exhibit exceptional lithographic performance. See, for instance, the results of Examples 3 and 4 which follow.

Among other things, resists of the invention can be lithographically processed under relatively mild conditions, particularly under mild pre-exposure and post-exposure thermal treatments. Additionally, resists of the invention can exhibit excellent resistance to plasma etchants used after development of the resist image.

That package of lithographic properties is of significant utility. In particular, a recognized shortcoming of resists that can be processed under relatively mild conditions, such as acetal-based positive resists, is that those resists exhibit inferior plasma etch resistance relative to resists that are processed under more vigorous conditions (e.g., so-called high temperature resists such as those that contain a phenolic/t-butyl acrylate copolymer and are post-exposure baked at comparatively high temperatures).

Thus, resists of the invention can exhibit desired properties of both the so-called low temperature resists, i.e. mild processing conditions, as well as the properties of the high temperature resists, i.e. robust plasma etch resistance.

Preferred photoacid labile units contain carbocyclic aryl (particularly phenyl)-alkyl groups. Preferably, the alkyl group is directly (no other interposed atoms) to a heteroatom such as oxygen of the photoacid labile unit. Even more preferred is where a saturated, tertiary carbon (no hydrogen substituent) of the arylalkyl moiety is directly linked to a hetero atom of the photoacid labile unit. Specifically preferred are ester photoacid labile units that comprise the following Formula I:

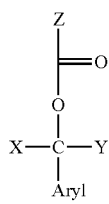

wherein in that Formula I, X and Y are the same or different and each non-hydrogen substituents such as optionally substituted alkyl, particularly optionally substituted $C_{1-8}$alkyl, more typically $C_{1-3}$alkyl; optionally substituted alkoxy, particularly optionally substituted $C_{1-8}$alkoxy, more typically $C_{1-3}$alkoxy; optionally substituted aryl such as optionally substituted carbocyclic aryl particularly phenyl, naphthyl, and the like;

Aryl is an aromatic group, preferably an optionally substituted carbocyclic aryl group such as optionally substituted phenyl or naphthyl; Aryl also may be a heteromaratic group particularly such groups that have 1–3 fused or linked rings and contain one or more sulfur or oxygen ring atoms such as coumarinyl, quinolinyl, furyl, thiazolyl, oxazolyl, oxidizolyl, benzofuranyl and benzothiazole, although carbocyclic aryl groups are generally more preferred than heteroaromatic groups; and Z is a linker to the polymer chain such as a chemical bond, optionally substituted alkylene having from 1 to about 8 carbons, and the like.

Polymers of the invention also may contain units in addition to photoacid labile groups with arylalkyl groups. For example, dissolution enhancers may be included in a polymer of the invention, such as anhydrides and lactones. Contrast enhancing groups also may be present in polymers of the invention, such as groups provided by polymermization of methacrylic acid, acrylic acid, and such groups protected with photoacid labile groups e.g. ethoxyethyl methacrylate, t-butoxy methacrylate, t-butylmethacrylate and the like. Groups that are essentially inert to photolithography also may be employed, such as carbocyclic aryl groups, particularly phenyl groups, which may be provided by reaction of styrene, and phenyl or other aryl groups that are optionally substituted by moieties that are essentially unreactive to thermal (e.g. between about 150 to 200° C.) and photoacid conditions of photolithography.

Photoresists of the invention also may contain a blend of resins, where at least one blend member comprises photoacid labile units that contain an arylalkyl moiety. Preferably, the blend also comprises a resin that contains photoacid labile groups that can be deblocked in the presence of photoacid at relatively low temperatures, e.g. a resin that contains acetal or ketal photoacid labile groups.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. The invention also includes methods for manufacturing such articles, particularly semiconductor chips, using a photoresist and/or polymer of the invention.

Other aspects of the invention are disclosed infra.

DETAILED DESCRIPTION OF THE INVENTION

As stated above, polymers of the invention comprise a photoacid labile unit that includes an arylalkyl group. Optionally substituted benzyl is a particularly preferred arylalkyl group.

Preferred polymers of the invention may include additional units. For instance, preferred polymers of the invention comprise units of: 1) photoacid labile units that contain an arylalkyl moiety; and 2) hydroxyphenyl units such as may be provided by polymerization of hydroxystyrene, particularly para-hydroxystyrene and/or meta-hydroxystyrene. Preferred polymers also may comprise further units that include a phenyl group that is not substituted by hydroxy, or other strongly polar group such as carboxy, as may be provided e.g. by polymerization of an optionally substituted styrene.

Acrylate-containing polymers are particularly preferred. References herein to an acrylate compound or polymer includes substituted acrylates such as a methacrylate. Phenolic/acrylate copolymers and higher order polymers such as terpolymers and tetrapolymers are particularly preferred, with the acrylate unit being photoacid labile and containing an arylalkyl moiety.

Particularly preferred higher order polymers of the invention include polymers that comprise polymerized units of: 1) para-hydroxystyrene; 2) meta-hydroxystyrene; and 3) photoacid labile units that contain an arylalkyl moiety such as a benzylic moiety, particularly where the photoacid labile unit is an ester as may be provided by polymerization of an acrylate compound that has an arylalkyl moiety.

Additional preferred higher order polymers of the invention include polymers that comprise polymerized units of: 1) hydroxystyrene, either para-hydroxystyrene or meta-hydroxystyrene; 2) styrene, where the phenyl ring is unsubstituted, or at least unsubstituted by strongly polar groups such as hydroxy or carboxy; and 3) photoacid labile units that contain an arylalkyl moiety such as a benzylic moiety, particularly where the photoacid labile unit is an ester as may be provided by polymerization of an acrylate compound that has an arylalkyl moiety.

References herein to styrenes and ring-substituted styrenes such as hydroxystyrene are inclusive of compounds that are substituted by other than hydrogen at one or more of the vinylic carbons that are polymerized, e.g. the terms are inclusive of alpha-methyl styrene and the like.

Particularly preferred phenolic polymers of the invention include a structure of the following Formula II:

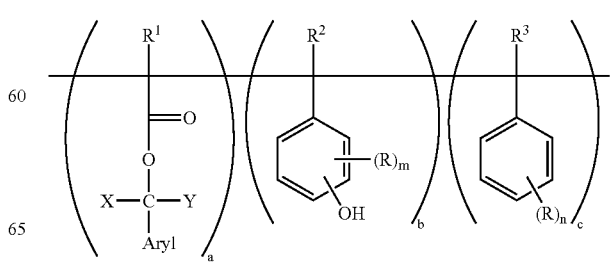

wherein X and Y are the same or different and are each non-hydrogen substituents such as optionally substituted alkyl, particularly optionally substituted $C_{1-8}$alkyl, more typically $C_{1-3}$alkyl; optionally substituted alkoxy, particularly optionally substituted $C_{1-8}$alkoxy, more typically $C_{1-3}$alkoxy; optionally substituted aryl such as optionally substituted carbocyclic aryl particularly phenyl, naphthyl, and the like;

Aryl is an aromatic group, preferably an optionally substituted carbocyclic aryl group such as optionally substituted phenyl or naphthyl; Aryl also may be a heteromaratic group particularly such groups that have 1–3 fused or linked rings and contain one or more sulfur or oxygen ring atoms such as coumarinyl, quinolinyl, furyl, thiazolyl, oxazolyl, oxidizolyl, benzofuranyl and benzothiazole, although carbocyclic aryl groups are generally more preferred than heteroaromatic groups each R is the same or different non-hydrogen substituent and may be e.g. hydroxy, halogen (F, Cl, Br, I); nitro; cyano; optionally substituted alkyl preferably having 1 to about 8 carbon atoms; optionally substituted alkenyl preferably having 2 to about 8 carbon atoms; optionally substituted alkynyl preferably having 2 to about 8 carbon atoms; halogen (F, Cl, Br, I); nitro; cyano; optionally substituted alkoxy preferably having 1 to about 8 carbon atoms; optionally substituted alkylthio preferably having 1 to about 8 carbon atoms; and the like;

$R^1$, $R^2$ and $R^3$ are independently hydrogen or optionally substituted $C_{1-8}$alkyl, preferably hydrogen or methyl;

m is an integer of zero (where the ring is only substituted by hydroxy) to 4; and n is an integer of from zero (where the ring is unsubstituted) to five; and a, b and c are mole percents of the each of the depicted units, and a and b are each greater than zero, and c is zero (i.e. no further styrenic units) or greater.

Particularly preferred phenolic polymers of the invention include those that contain both meta-hydroxystyrene and para-hydroxystyrene units such as a structure of the following Formula III:

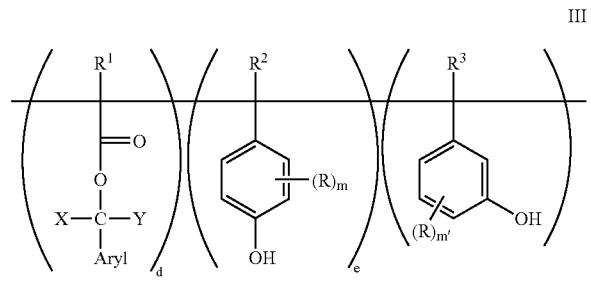

wherein X and Y are the same or different and are each non-hydrogen substituents such as optionally substituted alkyl, particularly optionally substituted $C_{1-8}$alkyl, more typically $C_{1-3}$alkyl; cyano; optionally substituted alkoxy, particularly optionally substituted $C_{1-8}$alkoxy, more typically $C_{1-3}$alkoxy; optionally substituted aryl such as optionally substituted carbocyclic aryl particularly phenyl, naphthyl, and the like;

Aryl is an aromatic group, preferably an optionally substituted carbocyclic aryl group such as optionally substituted phenyl or naphthyl; Aryl also may be a heteromaratic group particularly such groups that have 1–3 fused or linked rings and contain one or more sulfur or oxygen ring atoms such as coumarinyl, quinolinyl, furyl, thiazolyl, oxazolyl, oxidizolyl, benzofuranyl and benzothiazole, although carbocyclic aryl groups are generally more preferred than heteroaromatic groups;

each R is the same or different non-hydrogen substituent and may be e.g. hydroxy, halogen (F, Cl, Br, I); nitro; cyano; optionally substituted alkyl preferably having 1 to about 8 carbon atoms; optionally substituted alkenyl preferably having 2 to about 8 carbon atoms; optionally substituted alkynyl preferably having 2 to about 8 carbon atoms; halogen (F, Cl, Br, I); nitro; cyano; optionally substituted alkoxy preferably having 1 to about 8 carbon atoms; optionally substituted alkylthio preferably having 1 to about 8 carbon atoms; and the like;

$R^1$, $R^2$ and $R^3$ are independently hydrogen or optionally substituted $C_{1-8}$alkyl, preferably hydrogen or methyl;

m and m' are each independently zero (where the ring is only substituted hydroxy) to 4; and d, e and f are mole percents of the each of the depicted units and are each greater than zero.

In the above Formulae I, II and III, preferred X and Y groups include electron-donating groups such as optionally substituted alkyl, optionally substituted alkoxy, optionally substituted phenyl or other aryl, and the like. Such electron-donating groups can serve to stabilize the carbocation intermediate during the photoacid- induced deprotection reaction.

In the above Formulae II and III, suitably the benzylic photoacid labile unit is present in an amount of from about 4, 5, 10, 15, 20, 25, 30, 40 or 50 mole percent or more based on total polymer units, more preferably the benzylic photoacid labile unit is present in an amount of from about 10 to 30 mole percent based on total polymer units.

Suitably a phenolic polymer of the invention contains from about 30 to 90 mole percent phenolic units, more preferably about 40 to 60 mole percent phenolic units. Polymers that contain non-phenolic (no hydroxy or carboxy substitution) phenyl units suitably have such units present in an amount of from about 3 to 30 or 40 mole percent based on total polymer units, preferably from about 5 to about 10, 15 or 20 mole percent based on total polymer units.

As discussed, various moieties described herein, including moieties of polymers of the above formulae may be optionally substituted. A "substituted" group may be substituted at one or more available positions, typically 1, 2, or 3 positions by one or more suitable groups such as e.g. halogen (particularly F, Cl or Br); cyano; nitro; $C_{1-6}$alkyl sulfonyl such as mesyl; $C_{1-8}$alkyl; $C_{1-8}$alkoxy; $C_{2-8}$alkenyl; $C_{2-8}$alkynyl; hydroxyl; alkanoyl such as a $C_{1-6}$alkanoyl e.g. acyl and the like; etc.

Polymers of the invention can be prepared by a variety of methods.

To provide a suitable monomer having an arylalkyl moiety, one suitable method includes reaction of an aryl ketone with a Grignard reagent such as an alkyl or aryl lithium reagent to provide a tertiary alcohol. That aryl tertiary alcohol then can be reacted with an acrylate chloride to provide an acrylate having an arylalkyl substitution. See Example 1 which follows for exemplary preferred reagents and reaction conditions.

The polymer may be suitably formed by an addition reaction which may include free radical polymerization, e.g., by reaction of selected monomers (one of which include a photoacid-labile group with arylalkyl substitution ) to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed. See Example 2 which follows for exemplary reagents and reaction conditions.

Suitable monomers for reaction to provide polymers of the invention include optionally substituted vinyl phenyl, optionally substituted styrene, optionally substituted alpha-methyl styrene, methacrylonitrile, acrylonitrile, 2-methyladamantylmethacrylate, 2-methyladamantylacrylate, or a alpha-butyrolactone methacrylate.

Other monomers that can be reacted to provide a polymer of the invention can be identified by those skilled in the art. For example, to provide acid labile groups other than those that contain an arylalkyl group, other corresponding monomers can be reacted such as t-butymethacrylate, t-butylacrylate, t-butoxy methacrylate, t-butylmethacrylate; ethoxyethyl methacrylate, and the like; to provide pendant acid groups corresponding monomers acid monomers can be reacted such as methacrylic acid and acrylic acid; and dissolution enhancers such as anhydrides which may be provided by reaction of suitable monomers such as itaconic anhydride and the like.

Suitably a polymer of the invention suitably will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

Polymers of the invention used in photoresist formulations should contain a sufficient amount of photogenerated acid labile ester groups to enable formation of resist relief images as desired. For instance, as indicated above, suitable amounts of such acid labile ester groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, further provided are photoresist compositions that comprise the described polymers as a resin binder component.

The photoresist compositions of the invention can provide highly resolved relief images upon exposure to short wavelengths, particularly 248 nm. The photoresists of the invention preferably are chemically-amplified positive resists, which utilize photoacid-induced cleavage of pendant alkyl ester polymer groups to provide solubility differentials between exposed and unexposed areas of a resist coating layer.

Polymers of the invention used in photoresist formulations should contain a sufficient amount of photogenerated acid labile ester groups to enable formation of resist relief images as desired. For instance, a suitable amount of such acid labile ester groups will be at least 1 mole percent of total units of the polymer, more preferably about 2 to 50 or 60 mole percent. See the examples which follow for exemplary preferred polymers.

As discussed above, resists of the invention may contain one or more polymers in addition to and distinct from a polymer having an arylalkyl photoacid labile unit. Such additional polymers include those that have photoacid labile groups that may be deblocked under relatively mild conditions, e.g. a polymer than has acetal or ketal groups. Such a further polymer that has acetal or ketal groups suitably may be e.g. a phenolic polymer (e.g. a poly(vinylpheonol)) that has acetal groups grafted onto the phenolic —OH moieties such as by reaction of the phenolic polymer with ether vinyl ether or other vinyl ether.

The amounts of each member of such a resin blend may vary rather widely, e.g. the weight ratio of a polymer having arylalkyl photoacid labile units relative to a second distinct resin (e.g. having acetal or ketal photoacid labile groups) may be 1:10 to 10:1. Preferred mixture weight ratios may include the polymer having arylalkyl photoacid labile units relative to a second distinct resin (e.g. having acetal or ketal photoacid labile groups) of from about 2:8 to 8:2.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Suitable photoacid generators include imidosulfonates such as compounds of the following formula:

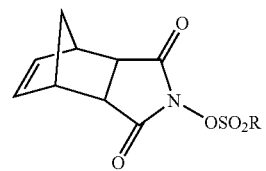

wherein R is camphor, adamantane, alkyl (e.g. $C_{1-12}$alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

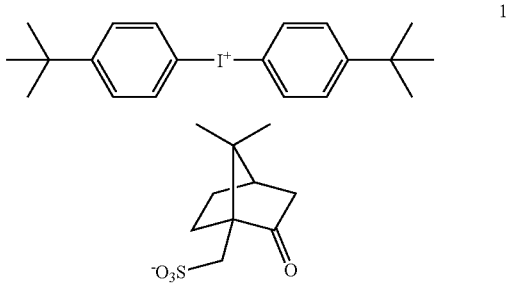

1

-continued

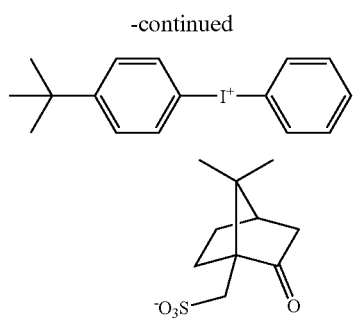

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

A preferred optional additive of resists of the invention is an added base, particularly tetrabutylammonium hydroxide (TBAH), or tetrabutylammonium lactate, which can enhance resolution of a developed resist relief image. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions of the invention are preferably photoactivated by a short exposure wavelength, particularly sub-300 nm exposure wavelengths such as 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at about 365 nm. Resists of the invention also will be useful for exposure with electron beams (E-beam exposure) and extreme-UV exposure (EUV) such as sub-50 nm or sub-20 nm exposure, particularly 13 nm exposure.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Synthesis of Monomer Containing Benzylic Photoacid-labile Group.

The following materials were used to synthesize a 2-propylphenylmethacrylate (PPMA) monomer (i.e. $CH_2=CH(CH_3)-C(=O)OC(CH_3)_2C_6H_5$):

| Material | Amt (g) | Amt (ml) | Moles |
|---|---|---|---|
| Acetophenone | 122.3 | 118.7 | 1.018 |
| Methyl lithium 1.4 M in ether | | 800 | 1.12 |
| Methacryloyl chloride | 122.4 | 114.4 | 1.17 |
| Tetrahydrofuran | 480 | 540 | |

All reaction glassware was dried in the oven overnight at 100° C. The glassware was set up and cooled under a stream of nitrogen. The reaction was carried out under a blanket of nitrogen.

To a 2L 3N-RB flask fitted with a gas inlet, thermometer, overhead stirrer and a rubber septum was added 800 ml of 1.4M methyl lithium diethyl ether solution via a double tipped needle using nitrogen pressure. The mixture was cooled to −25 to −30° C. using a dry ice/isopropanol bath. While the methyl lithium solution was cooling the 122.3 g of acetophenone was dissolved in 480 ml of tetrahydrofuran. To a 1L 3N-RB flask equipped with a gas inlet, glass stopper and a rubber septum was added the 122.3 g of acetophenone. The anhydrous, inhibitor free tetrahydrofuran was transferred to the 1L flask via a double tipped needle using nitrogen pressure. When the methyl lithium was at −25 to −30° C., the acetophenone/THF solution was transferred over a 2 hr period to the 2L 3N-RB flask containing the methyl lithium via a double tipped needle using nitrogen pressure. The cooling bath was removed and the reaction mixture was stirred for 2.5 hrs. After stirring for 2.5 hrs the mixture was again cooled to −25 to −30° C. using a dry ice/isopropanol bath. The methacryloyl chloride (122.4 g) was then added dropwise over a 1.5 hour period using a 125 ml pressure equalizing dropping funnel. The cooling bath was removed and the reaction was allowed to come to room temperature with overnight stirring. A white precipitate developed from the reddish-orange colored reaction solution. The salts (47.2 g) were removed. The filtrate was washed with 1×500 ml of a 10% sodium bicarbonate solution (color change from reddish-orange to orange) followed by 3×500 ml deionized water then dried over magnesium sulfate. The THF was removed leaving 208 g of orange oil. The orange oil was vacuum distilled at 55–60° C./1 mm to yield 136 g of white crystalline product (after cooling in refrigerator). Theoretical yield: 207.9 g; actual yield: ~65%.

EXAMPLE 2

Synthesis of a Polymer of the Invention. (70/10/20 para-hydroxystyrene-co-styrene-co-phenylpropyl-methacrylate (400 mmol scale).

The following reagents were used:
45.413 g: 4-acetoxystyrene,
4.166 g: styrene,
16.341 g: phenylpropylmethacrylate,
3.076 g: 2,2-Azobis(2-methylbutyronitrile) [VAZO67], Those reagents were charged in a 3-necked round bottom flask with attached cold water condenser and dissolved in the following solvent mixture: 117.75 g of 2-propanol, and 19.625 g of acetonitrile. $N_2$ gas was bubbled through reaction mixture for 0.5 hrs Using heating mantle reaction mixture brought to gentle reflux for 20 hrs.

Thereafter, 43.165 g ammonium acetate dissolved in 21.582 g deionized water then added to reactor. Reaction mixture held at gentle reflux for additional 20 hrs. The heating mantle removed and reactor allowed to cool to room temperature.

The resulting polymer was washed as follows: 03.704 g IRN-77 Ion Exchange beads washed four times with 1L DI water, then washed 3 times with 1L acetone, then washed 2 times with 1L 2-propanol. Washing procedure consisted of gently stirring beads in solvent, then decanting excess solvent. Reaction mixture added to bottle containing washed beads. Rolled for 3 hours. Ion Exchange beads filtered from reaction mixture. Reaction Mixture precipitated dropwise into 2.5L deionized water. Stirred for 1 hour. Polymer vacuum-filtered from waste water. Polymer vacuum dried 20 hrs at 70° C. Polymer dissolved in 2-propanol to 25% solids by weight(150 g 2-propanol).

10 g IRN-77 ion exchange beads washed by similar procedure described above 4 times in 0.1L DI water, 3 times in 0.1L acetone, then 2 times 0.1L 2-propanol. Ion exchange beads added to dissolved polymer in bottle and rolled three hours. Ion exchange beads filtered from dissolved polymer.

Polymer solution precipitated into 2.5L DI water. Stirred one hour. Polymer vacuum filtered from waste water. Vacuum dried 20 hrs at 70° C. Polymer slurried in 0.5L methylene chloride for 3 hours. Polymer vacuum dried for 20 hours at 70° C. Yield 38.9 g.

EXAMPLE 3

Photoresist Preparation and Lithographic Processing

A photoresist of the invention was prepared by admixing the following components in the specified amounts:

| Resist component | Amount |
|---|---|
| Resin | to provide 11.4 wt. % total solids liquid formulation |
| Photoacid generator | 3.53 wt. % of resin component |
| Basic additive | 0.113 wt. % of polymer |
| Surfactant | 0.05 wt. % of total solids. |

In that resist, the polymer was a p-hydroxystyrene/m-hydroxystyrene/PPMA terpolymer prepared as described in Example 2 with molar percents of each unit (based on total units of the polymer) of 10 mole percent p-hydroxystyrene; 70 mole percent meta-hydroxystyrene; and 20 mole percent PPMA as prepare din Example 1. The polymer had an Mw of 12639 and an Mn of 5824. The photoacid generator of the resist was di-tertbutylphenyliodonium camphorsulfonate. The basic additive was the lactate salt of tetremethylammoniium hydroxide. The surfactant was the commercially available material sold under the name R08. The solvent was ethyl lactate.

That photoresist composition was spin coated onto 200 mm silicon wafers having a coating of an organic antireflective composition. The applied photoresist later was soft-baked at 90° C. for 60 seconds and exposed through a photomask to 248 nm radiation. The exposed resist coating layer was then baked at 100° C. for 90 seconds and developed using an alkaline aqueous developer (30 seconds; single puddle). Highly resolved 150 nm equal lines and spaces (1:1) were obtained.

EXAMPLE 4

Additional Photoresist Preparation and Lithographic Processing

A photoresist of the invention was prepared by admixing the following components in the specified amounts:

| Resist component | Amount |
|---|---|
| Resin | to provide 11.4 wt. % total solids liquid formulation |
| Photoacid generator | 3.53 wt. % of resin component |
| Basic additive | 0.113 wt. % of polymer |
| Surfactant | 0.05 wt. % of total solids. |

In that resist, the polymer was a p-hydroxystyrene/styrene/PPMA terpolymer prepared as described in Example 2 with molar percents of each unit (based on total units of the polymer) of 10 mole percent p-hydroxystyrene; 70 mole percent styrene; and 20 mole percent PPMA. The polymer had an Mw of 14704 and an Mn of 6456. The photoacid generator of the resist was di-tertbutylphenyliodonium camphorsulfonate. The basic additive was the lactate salt of tetremethylammoniium hydroxide. The surfactant was the commercially available material sold under the name R08. The solvent was ethyl lactate.

That photoresist composition was spin coated onto 200 mm silicon wafers having a coating of an organic antireflective composition. The applied photoresist later was softbaked at 90° C. for 60 seconds and exposed through a photomask to 248 nm radiation. The exposed resist coating layer was then baked at 100° C. for 90 seconds and developed using an alkaline aqueous developer (30 seconds; single puddle). Highly resolved 150 nm equal lines and spaces (1:1) were obtained.

This invention has been described in detail with reference to preferred embodiments thereof. However, it will be appreciated that those skilled in the art, upon consideration of this disclosure, may modifications and improvements within the spirit and scope of this invention.

What is claimed is:

1. A chemically-amplified positive photoresist composition comprising one or more photoacid generator compounds and a polymer that comprises a structure of the following formula:

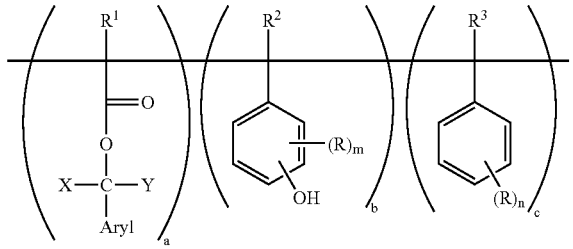

wherein X and Y are the same or different and are each non-hydrogen substituents;
Aryl is an aromatic group;
each R is the same or different non-hydrogen substituent;
R$^1$, R$^2$ and R$^3$ are independently hydrogen or optionally substituted C$_{1-8}$alkyl;
m is an integer of zero to 4; and n is an integer of from zero to five; a, b and c are mole percents of the each of the depicted units and are each greater than zero,
wherein (i) the polymer further comprises lactone groups or (ii) the photoresist comprises a further resin comprising acetal photoacid labile groups.

2. The photoresist composition of claim 1 wherein the polymer further comprises phenyl groups.

3. The photoresist composition of claim 1 wherein the polymer further comprises anhydride groups.

4. The photoresist composition of claim 1 wherein the polymer further comprises cyano groups.

5. The photoresist composition of claim 1 wherein the polymer comprises an alicyclic group.

6. A method of forming a positive photoresist relief image, comprising:
(a) applying a coating layer of a photoresist of claim 1 on a substrate; and
(b) exposing and developing the photoresist layer to yield a relief image.

7. The method of claim 6 wherein the phororesist layer is exposed with radiation having a wavelength of about 248 nm.

8. An article of manufacture comprising a microelectronic wafer substrate having coated thereon a layer of the photoresist composition of claim 1.

9. A method of manufacturing a semiconductor microchip wafer, comprising applying a coating layer of a photoresist composition of claim 1 onto a microchip wafer substrate.

10. The photoresist composition of claim 1 wherein X and Y are each alkyl.

11. The photoresist composition of claim 1 wherein X and Y are each alkyl having 1 to 3 carbon atoms.

12. The photoresist composition of claim 1 wherein m is zero.

13. The photoresist composition of claim 12 wherein n is zero.

14. The photoresist composition of claim 1 wherein n is zero.

15. A chemically-amplified positive photoresist composition comprising one or more photoacid generator compounds and a polymer that comprises a structure of the following formula:

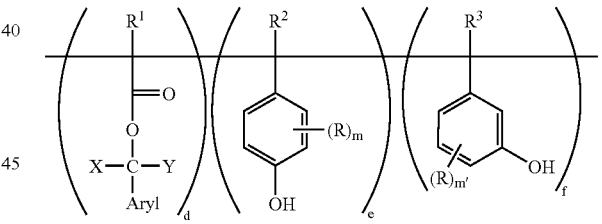

wherein X and Y are each the same or different non-hydrogen substituents;
Aryl is an aromatic group;
each R is the same or different non-hydrogen substituent;
R$^1$, R$^2$ and R$^3$ are independently hydrogen or optionally substituted C$_{1-8}$alkyl;
m and m' are each independently zero to 4; and d, e and f are mole percents of the each of the depicted units and are each greater than zero.

16. The photoresist composition of claim 15 wherein X and Y are each alkyl.

17. The photoresist composition of claim 15 wherein X and Y are each alkyl having 1 to 3 carbon atoms.

18. The photoresist composition of claim 15 wherein m is zero.

19. The photoresist composition of claim 18 wherein m' is zero.

* * * * *